United States Patent [19]

Karner et al.

[11] Patent Number: 4,965,654
[45] Date of Patent: Oct. 23, 1990

[54] SEMICONDUCTOR PACKAGE WITH GROUND PLANE

[75] Inventors: Friedrich A. Karner, Milton; Douglas W. Phelps, Jr., Burlington; Stephen G. Starr, Essex Junction; William C. Ward, Burlington, all of Vt.

[73] Assignee: International Business Machines Corporation, Armonk, N.Y.

[21] Appl. No.: 428,533

[22] Filed: Oct. 30, 1989

[51] Int. Cl.⁵ .................. H01L 23/48; H01L 23/12; H01L 23/54
[52] U.S. Cl. .................................. 357/70; 357/71; 357/68
[58] Field of Search ............... 357/70, 80, 67, 71, 357/68; 174/52.4

[56] References Cited

U.S. PATENT DOCUMENTS

| | | | |
|---|---|---|---|
| 4,791,473 | 12/1988 | Phy | 357/70 |
| 4,796,078 | 1/1989 | Phepls, Jr. et al. | 357/68 |
| 4,833,521 | 5/1989 | Early | 357/68 |
| 4,862,245 | 8/1989 | Pashby et al. | 357/70 |
| 4,916,519 | 4/1990 | Ward | 357/70 |

*Primary Examiner*—Rolf Hille
*Assistant Examiner*—S. V. Clark
*Attorney, Agent, or Firm*—Francis J. Thornton

[57] ABSTRACT

A plastic encapsulated semiconductor package in which the connecting lead frame members are deposited over the surface of the device together with a covering ground plane so as to provide enhanced electrical and thermal coupling of the members and the device and so reduce the signal to noise ratio by a factor or greater than three over that available in other similar plastic encapsulated packages while simultaneously improving the transfer of heat out of the package.

In particular, a lead frame having a plurality of conductors is attached to a major active surface of a semiconductor chip via a ground plane which, in the preferred embodiment, is a multilayered structure containing an insulated integral, uniform ground plane positioned between the lead frame and the chip and adhesively and insulatively joined to both of them. Wires connect terminals on the major active surface of the semiconductor chip to the ground plane and to selective lead frame conductors. The lead frame, the ground plane structure, the semiconductor chip, and the wires which connect the semiconductor chip terminals to the ground plane and to selected lead frame conductors are encapsulated with a suitable insulating material to form a semiconductor module or package.

9 Claims, 3 Drawing Sheets

SEMICONDUCTOR PACKAGE WITH GROUND PLANE

BACKGROUND OF THE INVENTION

1. Field of the Invention

This invention relates to a semiconductor packaging structure in which lead frame conductors used to plug a semiconductor structure into a socket or pc board extend over and are adhesively joined to the surface of the chip via an insulated conductive ground plane structure positioned between the lead frame and the chip surface and electrically connected to a respective lead frame conductor. The remainder of the lead frame conductors may be electrically connected to respective terminals on the semiconductor chip surface.

2. Description of the Prior Art

U.S. Pat. No. 4,862,245 assigned to the same assignee as the present invention, describes a technique for positioning and affixing leads to a semiconductor chip prior to encapsulation of the chip in a protective coating by extending the lead frame over the surface of the chip.

A common problem with the prior art semiconductor package occurs when the lead frame becomes highly packed and when the underlying semiconductor device is a so-called high performance device in which a signal frequency is in the sub-nanosecond range, in such devices the noise level can rise above the signal levels and signals can become lost and the heat generated by the device can be significantly increased. This noise to signal ratio and increase in generated heat effectively limits the use of these devices when they are packaged as taught in the referenced patent.

It is an object of this invention to provide a packaged semiconductor chip with improved electrical and thermal performance.

Still another object of the invention is to provide a packaged semiconductor chip in which noise levels are maintained below the signal levels of the chip when it is operating at a sub-nanosecond signal transfer rate.

It is a further object of the invention to provide a packaged semiconductor chip which has reduced crosstalk.

It is still a further object of the invention to provide a packaged semiconductor chip which as improved heat transfer characteristics.

It is still another object of the invention to provide a plastic encapsulated semiconductor package in which the connecting lead frame members are deposited over the surface of the device together with a covering ground plane so as to provide enhanced electrical and thermal coupling of the members and the device and so reduce the signal to noise ratio by a factor of greater than three over that available in other similar plastic encapsulated packages while simultaneously improving the transfer of heat out of the package.

These and other objects of the present invention are provided by attaching a lead frame, having a plurality of conductors, to a major active surface of a semiconductor chip via a ground plane. In the preferred embodiment, a multilayered structure containing an insulated integral, uniform ground plane is positioned between the lead frame and the chip and is adhesively and insulatively joined to both of them. As will be described later different adhesives may be used to attached the interposer to the chip and to the lead frame Wires connect terminals on the major active surface of the semiconductor chip to the ground plane and to selective lead frame conductors. The lead frame, the ground plane structure, the semiconductor chip, and the wires which connect the semiconductor chip terminals to the ground plane and to selected lead frame conductors are encapsulated with a suitable insulating material to form a semiconductor module or package.

A bus bar can be provided that extends along the entire length of the semiconductor chip to serve both as a ground bus and as a means for further dissipating heat generated by the chip. This bus bar is connected to the integral ground plane structure as well as to selected terminals on the semiconductor chip.

These and other objects, features and advantages of the invention will becomes more apparent from the following particular description of the preferred embodiment of the invention as illustrated in the accompanying drawings.

DESCRIPTION OF THE PREFERRED EMBODIMENT

Figure 1:
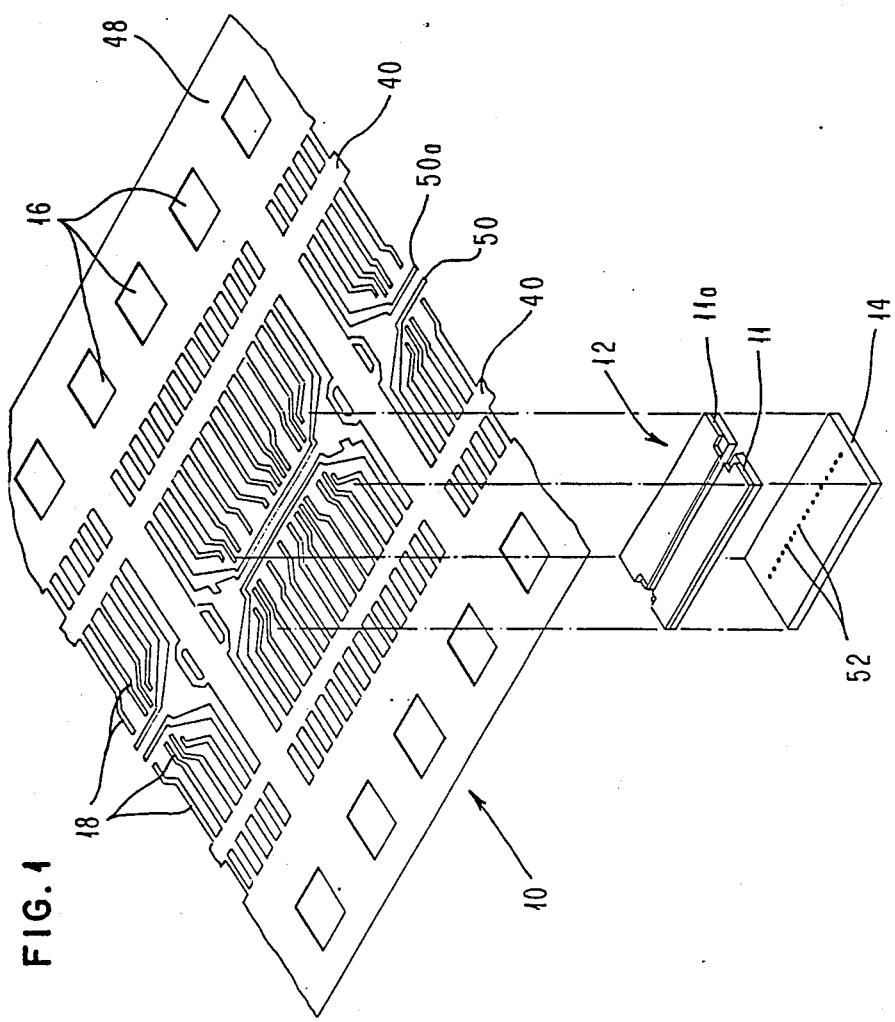
FIG. 1, is an exploded representation of one embodiment of the present invention showing the spacial relationship between the chip, the ground plane structure of the present invention and the lead frame.

FIG. 1, is an exploded view of one embodiment of the invention and shows a lead frame 10, a bipartite ground plane structure 12 of the present invention, and a semiconductor chip 14 arranged in their spacial relationship.

The lead frame 10 is produced from metal sheet stock and is provided with indexing holes 16. The sheet stock from which this lead frame is formed is preferably copper, although other alloys may of course be readily used. The term lead frame is well known in the art and the material thickness strength, etc. of such lead frames is well known and the use of this term lead frame is all that there is necessary to purchase such items from a number of commercial sources. Effectively, the term lead frame, in the art, means a metal structure formed from metal sheet stock and of sufficient size and strength to meet specific mechanical strength requirements. Typically, the conductors extending from the package for using such a lead frame are 0.004 to 0.008 inches thick and approximately 0.008 to 0.015 inches wide and are of sufficient strength to be successfully handled and inserted into socket or printed circuit boards without distortion and without buckling due to slight misalignment. Such lead frames are extensively used in and known to the semiconductor integrated circuit art.

Figure 2:
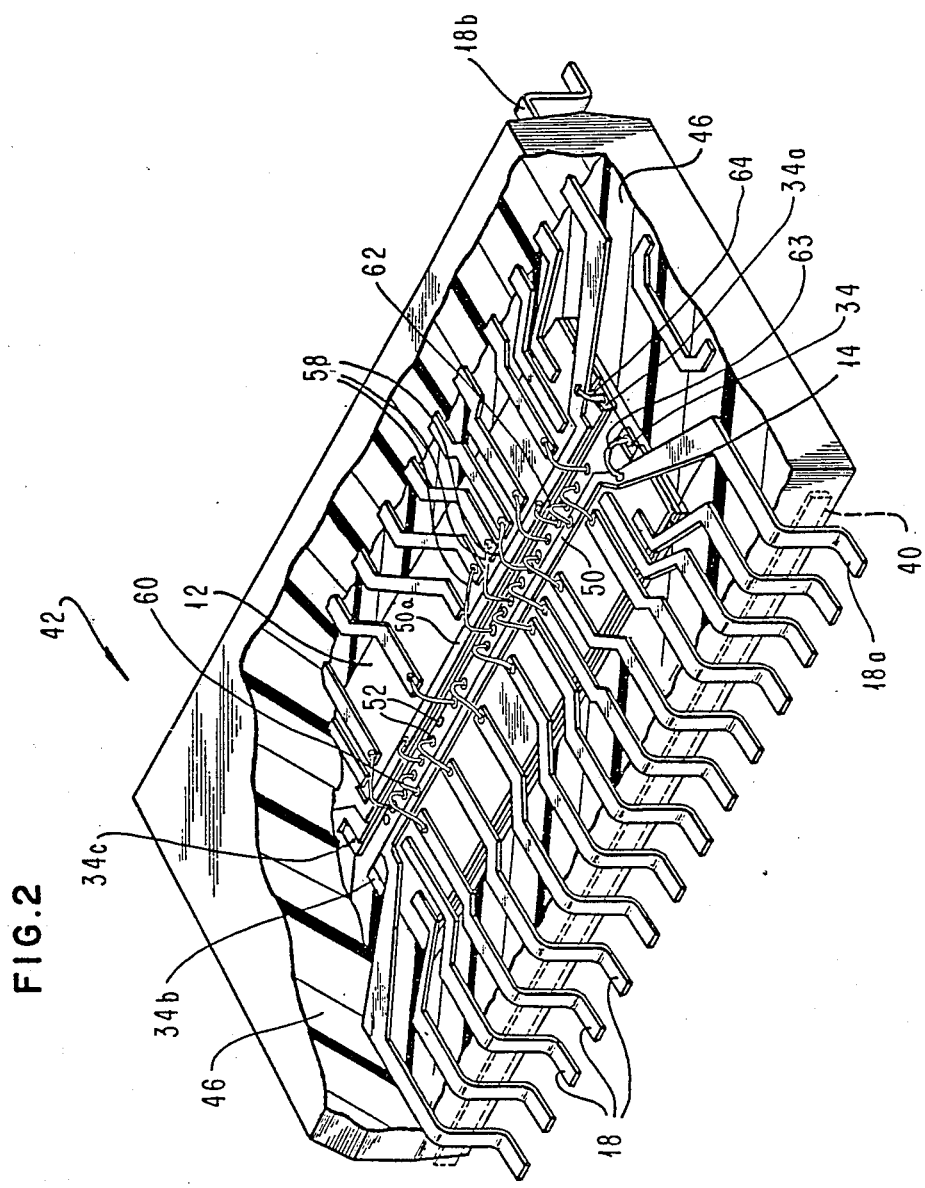
FIG. 2, is a partially broken away view of a wire bonded, encapsulated, semiconductor chip employing the present invention shown in FIG. 1.

FIG. 2, shows a package 42 in which a part of the encapsulating material 46 has been removed for clarity and to show the internal construction and arrangement of the lead frame, ground plane and semiconductor chip after assembly. After encapsulation the lead frame selvage 48 and the cross members 40, shown in FIG. 1, are removed. The conductors 18 which extend beyond the package 42 may be formed as required.

Figure 3:
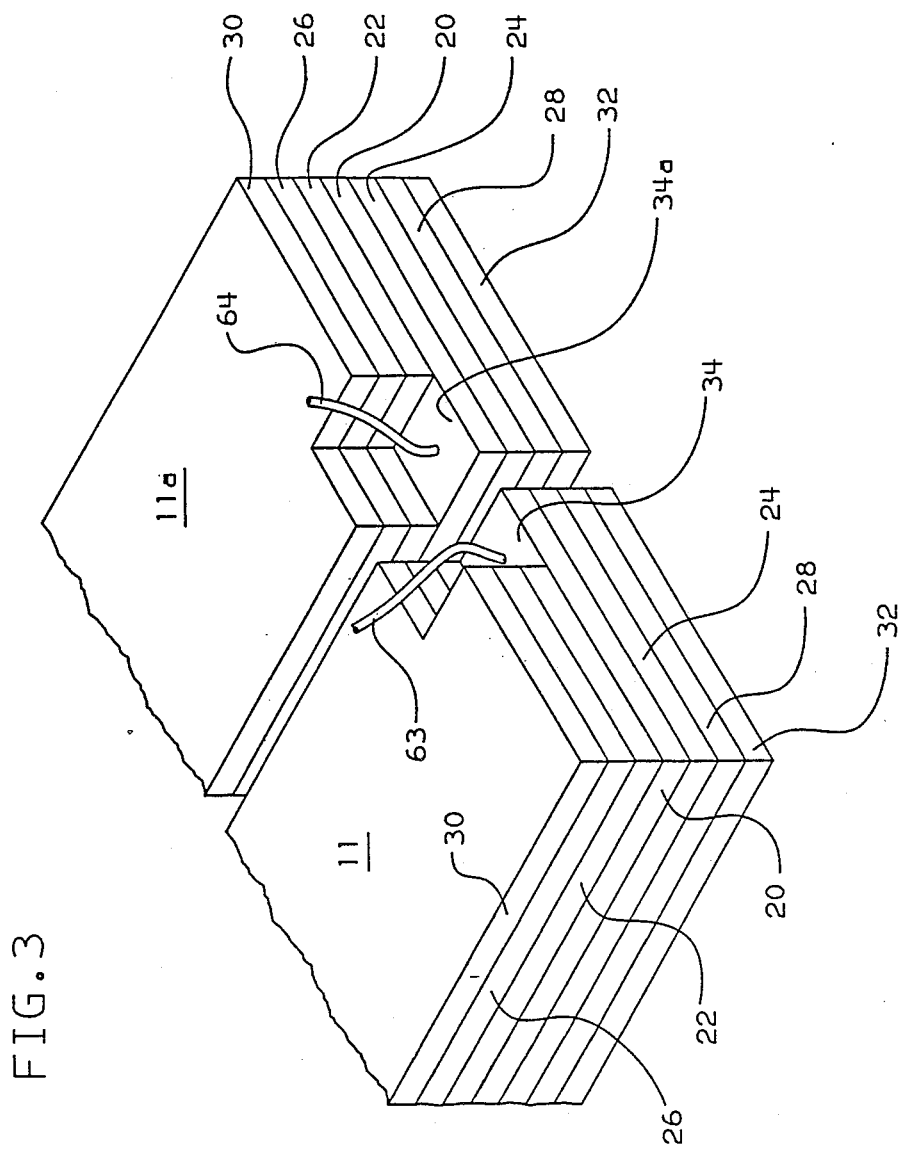
FIG. 3, is an enlarged view of one end of the ground plane structure used in the present invention showing its layered construction together with a portion of the bus bar and portions of the leads of the lead frame thereon.

The bipartite conductive ground structure as items 11 and 11a, is shown in greater detail in FIG. 3. With particular reference to FIG. 3, it is seen that each portion of the ground plane is a multilayered structure. Basically, each portion of the ground plane is a mirror image of the other and each consists of a metal sheet 20, preferably a copper sheet 0.0007 to 0.0014 inches thick, having said side bonded by 0.0008 inch thick adhesive layers 22 and 24, 0.001 inch thick polyimide films 26 and 28 to the underlying copper sheet 20 by 0.0008 inch thick adhesive layer. Preferably, these polyimide films 26 and 28 should have a melting temperature in excess of 175° C. and not contain ionizable species such as halides or other active metals such as sodium.

One such polyimide film, suitable for such a purpose, is sold by E. I. DuPont de Nemours and Company under the tradename KAPTON.

The adhesives 22 and 24 used to joined the polyimide layers 26 and 28 to the metallic sheet 20 preferably are either a butyrl phenolic, epoxy or an acrylic. These adhesives assure that the metal sheet 20 is fully bonded to the polyimide layers 26 and 28.

The polyimide films 26 and 28 are further coated with additional adhesive layers 30 and 22 respectively for bonding the ground plane structure to the lead frame 10 and to the chip 14. The adhesives used as these layers 30 and 32 to secure the ground plane structure 12 to the conductors 18 and the chip 14 are selected from the group of butyrl phenolics, epoxies or acrylics. Preferably, all adhesive layers are a butyrl phenolic since these materials assure that the conductors 18 are fully secured to the underlying ground plane member and chip with high thermal stability and low metallic ion corrosion resistance properties.

It should be noted that the inner corners of each portion 11 and 11a of the ground plane structure 12 is cut away to expose small areas 34, 34a, 34b and 34c, as shown in FIG. 2, of the upper surface of the inner metal sheets. These areas provide regions where conductive wires can be bonded to the inner metal sheets and to elongated bus bars 18a and 18b as shown in FIG. 2.

Referring back to FIG. 1, it should be noted that cross members 40 are provided between the conductors 18 of the lead frame 10 to apply rigidity to the lead frame 10 and to limit the flow of the encapsulating material when the semiconductor chip 14, the ground plane members, 11 and 11a, and the lead frame 10 are all assembled and encapsulated as shown in FIG. 2.

In FIG. 2, the leads are shown as formed and removed cross members are partially shown in phantom as 40'.

As shown in FIG. 2, various pads or terminals 52 are disposed along the center of the upper major surface of the semiconductor chip 14. These pads are in turn individually connected to respective leads 18 by wires 58 usually bonded of gold and preferably less than 100 mils in length. This arrangement not only facilitates high coverage of the active surface of the chip both with the ground plane but also with the leads 18 but also causes the wires 58 to maintain their shortest length. Similarly, a pair of bus bars 50 and 50a are disposed along the entire surface of the ground plane member parallel to and on each side of the pads 52. These bus bars 50 are connected via selected wires 60 and 62 to selected pads on the semiconductor surface This centrally positioned row of chip terminals necessitates that the ground plane be either broken into two sections as shown or to be a single unit having a slot down its center which would provide an opening for the line of terminal pads. By centrally locating these terminal pads 52 not only is the impedance of the chip reduced, but the chip is substantially faster than those chips where peripheral I/0 as is taught and used in the prior art. In addition, these bus bar members are connected via wires, 63 and 64, to the respective ground plane members 11 and 11a by bonding the wires 63 and 64 to the metal layers 20 at the exposed corners 34 and 34a. These bus bars are then passed out of the encapsulating structure where they are formed as leads 18a and 18b. By so connecting these members 11 and 11a of the ground plane structure 12 to the respective bus bars 50 and 50a not only is the signal to noise ratio reduced, but also additional heat can be extracted from the surface of the chip by spreading the heat by direct conduction through the ground plane 20, the dielectrics 26 and 28 and adhesives 22, 24, 30 and 32 and to the various lead frame members 18.

Thus, the addition of the ground plane greatly improves the extraction of heat from the active surface of the semiconductor chip 14.

By utilizing bus bars 18a and 18b that extends the length of the chip in close proximity to the line of centrally located terminal pads and by connecting these bus bars to selected ground positions on the semiconductor chip, as well as to the ground plane members, not only is the voltage drop through the chip minimized, but the signal to noise ratio in the conductors 18 carrying signals to and from the chip are also minimized. Additionally, the bus bars facilitate cooling by extracting heat through the ground plane since it is located over the portion of the active surface of the chip known to generate the heat and by conveying this heat vertically to the bus bars 50 and 50a and other leads 18 the heat is more readily extracted from the interior of the package.

While the novel features of this invention have been described in terms of the preferred embodiment and particular application it should be appreciated that various admissions and substitutions in form may be made by those skilled in the art without departing from the spirit and scope of the invention. It should be obvious to one skilled in the art that various arrangements and combinations can be created utilizing the concepts set forth in the invention and it is therefore requested that the present invention be limited only by the appended claims wherein

We claim:

1. An encapsulated semiconductor module comprising:
   a semiconductor chip having a major surface with terminals thereon disposed within an encapsulating material;
   a plurality of self supporting unitary, discrete, and continuous lead frame conductors formed of metal sheet stock extending over said major surface of said chip at spaced locations from said terminals, said lead frame conductor extending from said chip and cantilevered out of the encapsulating material;
   a ground plane interposed between said lead frame conductors and said major surface and insulatively bonded to said lead frame conductors and said major surface;
   discrete electrical conducting means bonded to said conductors and said terminals and electrically connecting said conductors to said terminals, and
   at least one electrical conducting means bonded to a selected one of said conductors and to said ground plane.

2. The module of claim 1 wherein said ground plane comprises a copper sheet having insulation thereon.

3. The module of claim 2 wherein the insulation comprises a polyimide.

4. The module of claim 1 wherein the ground plane comprises a multilayer structure consisting of a copper sheet having two major surfaces, an insulator adhesively joined to each major surface and an adhesive coating on each insulator for adhering said ground plane structures to said lead frame conductors and the major surface of the chip.

5. The module of claim 4 wherein the adhesives used in said structure is butyrl phenolic 6. The module of claim 1 wherein said ground plane is bipartite.

7. The module of claim 4 wherein said ground plane structure is provided with exposed areas on one of said major surfaces for bonding said electrical conducting means thereto.

8. The module of claim 1 wherein said electrical conducting means comprises a gold wire.

9. An encapsulated semiconductor module comprising;
a semiconductor chip having terminals thereon disposed within an encapsulating material;
a plurality of self supporting unitary, discrete, and continuous lead frame conductors, formed of metal sheet stock, extending over said chip and positioned to avoid contact with said terminals; said lead frame conductors extending from said chip and cantilevered out of the encapsulating material,
a ground plane having a terminal thereon positioned between said lead frame conductors and said chip,
electrically insulating material disposed between said chip and said ground plane and between said ground plane and said plurality of lead frame conductors, and attached to said plurality of lead frame conductors to said ground plane, and to said semiconductor chip with respective adhesive layers; and
discrete electrical conducting wire means respectively bonded to each conductor and electrically connecting a respective conductor to a respective terminal.

* * * * *